(12) United States Patent
Cranford et al.

(10) Patent No.: US 7,671,678 B2
(45) Date of Patent: *Mar. 2, 2010

(54) SERIAL LINK OUTPUT STAGE DIFFERENTIAL AMPLIFIER AND METHOD

(75) Inventors: Hayden C. Cranford, Cary, NC (US); Carrie E. Cox, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/117,098

(22) Filed: May 8, 2008

(65) Prior Publication Data

US 2008/0238554 A1    Oct. 2, 2008

Related U.S. Application Data

(63) Continuation of application No. 11/531,714, filed on Sep. 14, 2006, now Pat. No. 7,391,266.

(51) Int. Cl.
*H03F 3/45* (2006.01)

(52) U.S. Cl. .................................................. 330/261
(58) Field of Classification Search ......... 330/252–261, 330/207 P, 298; 341/135

See application file for complete search history.

(56) References Cited

U.S. PATENT DOCUMENTS

| 4,688,018 | A | * | 8/1987 | Vaughn | ........................ 341/136 |
| 5,914,681 | A | * | 6/1999 | Rundel | ........................ 341/135 |

* cited by examiner

*Primary Examiner*—Robert Pascal
*Assistant Examiner*—Hieu P Nguyen
(74) *Attorney, Agent, or Firm*—Mark McBurney; Joscelyn G. Cockburn; Daniel McConnell

(57) ABSTRACT

Protection for the transmission of higher amplitude outputs required of differential amplifiers formed by thin oxide transistors with limited maximum voltage tolerance used where compliance with communication protocol standards requires handling voltages which may, in transition, exceed desirable levels is provided by limiting the voltage across any two device terminals under power down conditions.

7 Claims, 1 Drawing Sheet

SERIAL LINK OUTPUT STAGE DIFFERENTIAL AMPLIFIER AND METHOD

RELATED APPLICATION

This application is a continuation of, and claims priority from, application Ser. No. 11/531,714 filed Sep. 14, 2006 and now U.S. Pat. No. 7,391,266 issued Jun. 24, 2008.

FIELD AND BACKGROUND OF INVENTION

This invention relates to a semiconductor differential amplifier and a method of protecting the amplifier against undesirable effects of transitional power events.

Integrated circuits based on semiconductor manufacturing process are well known. Such devices are understood to be formed by providing a suitable base and then forming electrical circuit components on the substrate. Such devices are understood to be formed with many such components on a single substrate, with such components functioning as transistors, resistors and other elements. Input/output (I/O) controllers, as one example only, are so formed and have components of the types described formed on the substrates supporting the components. This technology is well known and needs no further description here.

Many such integrated circuit devices or chips use as one type of component a differential amplifier. Differential amplifiers have been long recognized in the art, to the extent that there exist entire texts devoted to the characteristics and design of such amplifiers and their inclusion in large scale integrated circuits. The interested reader is referred to such texts for a deeper understanding of the invention here to be described.

Differential amplifiers function due to the imposition of voltages there across, and serve, among other purposes, to amplify the differences between two input voltages (hence the name) and to remove noise otherwise present in signals by operating in so-called common mode. One difficulty encountered with integrated circuits formed by the use of certain technologies is that voltages may be applied across a differential amplifier which result in either signal distortion beyond acceptable limits or damage to the components forming the amplifier. This is particularly true where an Integrated Circuit (IC) chip is made by a technology which is only capable of offering thin oxide transistors with limited maximum voltage tolerance and the element is used in a circumstance where compliance with communication protocol standards requires handling voltages which may, in transition, exceed desirable levels. Even if thick oxide devices are available in a given technology, and might be less susceptible to voltage problems, those devices are often incapable of the speed necessary to support the applications in question.

As device geometries shrink, the maximum supported power supply voltage also decreases. While this allows digital technology to have a higher maximum operating speed, IC I/O must continue to meet minimum output amplitude as dictated by communication standards. Achieving large output amplitudes often requires higher power supply voltages which, when imposed across a minimum geometry device, impair longevity.

SUMMARY OF THE INVENTION

With the foregoing in mind, it is one purpose of this invention to provide a protection for the transmission of higher amplitude outputs required of differential amplifiers in the contexts described. In realizing this purpose, the voltage across any two device terminals is limited under power down conditions.

BRIEF DESCRIPTION OF DRAWINGS

Some of the purposes of the invention having been stated, others will appear as the description proceeds, when taken in connection with the accompanying drawing, in which the differential amplifier circuit of this invention is shown in FIG. 1.

DETAILED DESCRIPTION OF INVENTION

Figure 1:
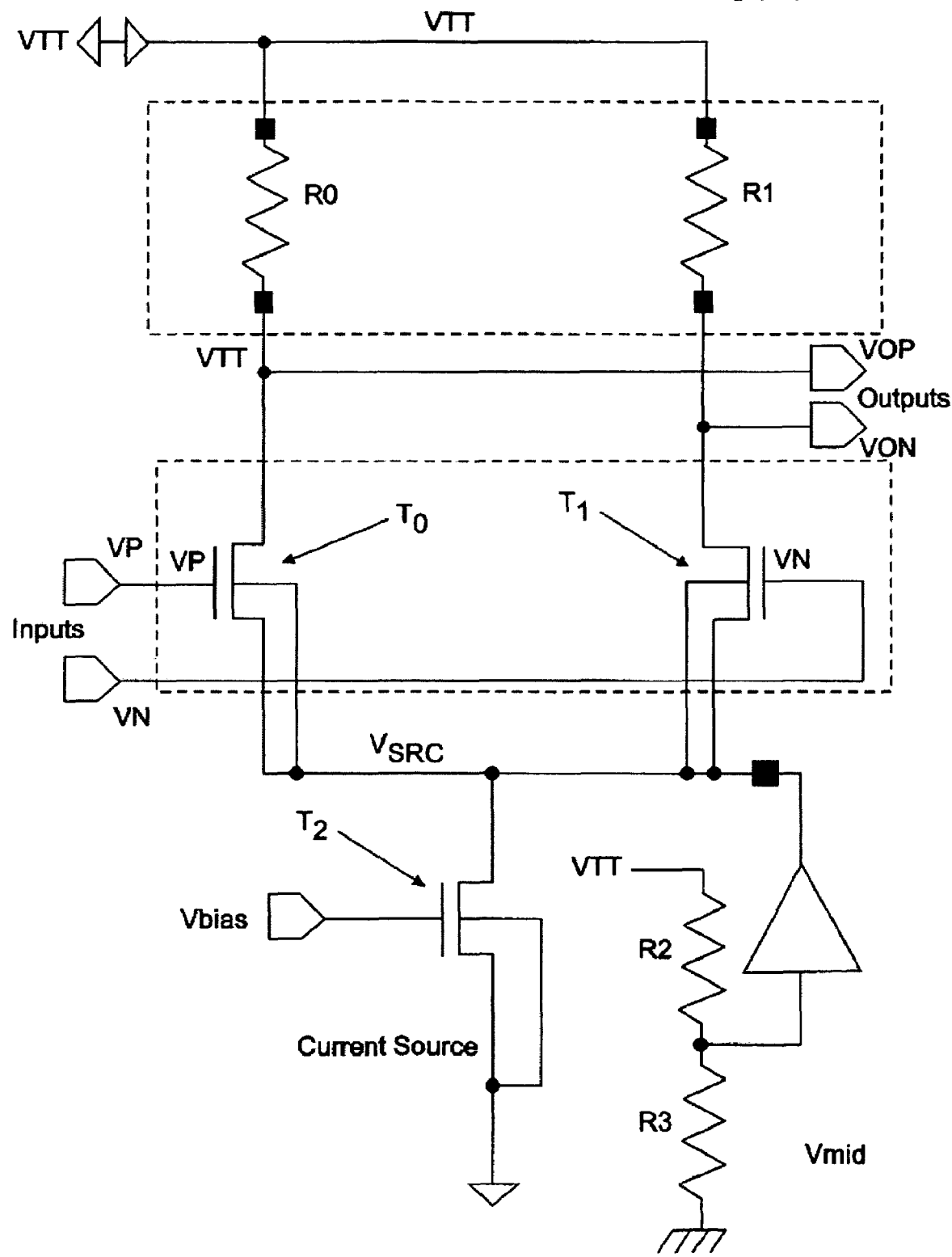

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Referring now to FIG. 1. The differential amplifier of this invention is there shown. The elements shown are formed on a substrate (not shown) as is conventional and well known in semiconductor manufacturing. It is the presence of this general knowledge on which reliance is placed for the absence of a specific illustration of the substrate.

The differential amplifier has a plurality of transistors, conductive traces coupling those transistors, and resistors. A differential pair of transistors, $T_0$ and $T_1$, serve as points for input of voltage signals into the amplifier, buffering an input differential voltage, input positive (VP) and input negative (VN). A bias $V_{mid}$ is controllably applied through a voltage buffer which forms a biasing circuit.

The bias applied is controlled by a coupling circuit including a transistor T2 operatively connected to the differential pair and the biasing circuit. The coupling circuit recognizes a powering down event for the differential amplifier circuit and a biasing voltage is applied from the biasing circuit to the differential amplifier circuit during the recognized powering down event, the biasing voltage protecting the differential amplifier circuit against degradation otherwise possible due to voltages imposed during the powering down event.

More particularly, and referring to element $T_0$ in the Figure, the drain-source voltage ($V_{ds}=V_{on}-V_{src}$), drain-gate voltage ($V_{dg}=V_{on}-V_p$) and drain-body voltage ($V_{db}=V_{on}-V_{src}$) can all become VTT−0 volts if the node $V_{src}$ isn't set by a voltage buffer and goes to zero volts. This would be an issue when VTT is greater than the voltage allowed for the $T_0$ element, which can occur in a high swing driver in recent CMOS technologies. The presence of the coupling circuit and biasing circuit of this invention protects against the degradation of the semiconductor elements which would occur where this voltage difference is imposed during a power down sequence.

In particular, the apparatus of this invention has a differential amplifier circuit as described and illustrated. Connected to the amplifier circuit are a biasing circuit and a coupling circuit. The coupling circuit recognizes a powering down event for the differential amplifier and a biasing voltage from the biasing circuit is applied to the differential amplifier circuit during the recognized powering down event, the biasing voltage protecting the differential amplifier circuit against degradation otherwise possible due to voltages imposed during the powering down event. During a powering down event, the current flowing though the resistors Ro and R1 goes to zero. Thus, there is no voltage drop across the resistors and voltage Vop=Von=Vtt absent the intervention of this invention.

The biasing voltage is applied through a buffer, and may be derived in a number of differing ways. What is shown is exemplary only, as it is recognized and contemplated that the biasing voltage can be derived from a number of sources and through a number of pathways other than from $V_{tt}$ and applied other than through a buffer circuit precisely as shown. The invention here is the intervention rather than the specifics of derivation of the biasing voltage.

Expressed as a method, the present invention contemplates employing a differential amplifier circuit in an environment where a minimum output amplitude must be met for compliance with a communication protocol and protecting the differential amplifier circuit from degradation otherwise possibly occurring by coupling a biasing circuit to the differential amplifier circuit in association with a coupling circuit which recognizes a powering down event for the differential amplifier circuit wherein a biasing voltage from the biasing circuit is applied to the differential amplifier circuit during the recognized powering down event, the biasing voltage protecting the differential amplifier circuit against degradation otherwise possible due to voltages imposed during the powering down event.

In the drawings and specifications there has been set forth a preferred embodiment of the invention and, although specific terms are used, the description thus given uses terminology in a generic and descriptive sense only and not for purposes of limitation.

What is claimed is:

1. Apparatus comprising:
   a differential amplifier circuit having a coupled pair of field effect transistor semiconductor devices;
   a biasing circuit; and
   a coupling circuit operatively connected to said differential amplifier circuit and said biasing circuit and having a field effect transistor semiconductor device;
   said coupling circuit field effect transistor semiconductor device being coupled with the source and body terminals of said coupled pair of field effect transistor semiconductor devices;
   said coupling circuit recognizing a powering down event for said differential amplifier circuit wherein a biasing voltage is applied from said biasing circuit to said differential amplifier circuit during the recognized powering down event, the biasing voltage protecting the differential amplifier circuit against degradation otherwise possible due to voltages imposed during the powering down event.

2. Apparatus according to claim 1 wherein said differential amplifier comprises a coupled pair of field effect transistor semiconductor devices.

3. Apparatus comprising:
   a differential amplifier circuit;
   a biasing circuit;
   a coupling circuit operatively connected to said differential amplifier circuit and said biasing circuit;
   said coupling circuit recognizing a powering down event for said differential amplifier circuit wherein a biasing voltage is applied from said biasing circuit to said differential amplifier circuit during the recognized powering down event, the biasing voltage protecting the differential amplifier circuit against degradation otherwise possible due to voltages imposed during the powering down event.

4. Apparatus according to claim 3 wherein said differential amplifier comprises a coupled pair of field effect transistor semiconductor devices.

5. Apparatus according to claim 3 wherein said differential amplifier comprises a coupled pair of complementary metal oxide field effect transistor semiconductor devices.

6. Apparatus according to claim 3 wherein said coupling circuit comprises a field effect transistor semiconductor device.

7. Apparatus according to claim 6 wherein said coupling circuit field effect transistor semiconductor device is coupled with the source and gate terminals of a coupled pair of field effect transistor semiconductor devices.

* * * * *